United States Patent
Liu et al.

(10) Patent No.: US 8,648,454 B2
(45) Date of Patent: Feb. 11, 2014

(54) WAFER-SCALE PACKAGE STRUCTURES WITH INTEGRATED ANTENNAS

(75) Inventors: Duixian Liu, Scarsdale, NY (US); Jean-Olivier Plouchart, New York, NY (US); Scott K. Reynolds, Amawalk, NY (US)

(73) Assignee: International Business Machines Corporation, Armonk, NY (US)

( * ) Notice: Subject to any disclaimer, the term of this patent is extended or adjusted under 35 U.S.C. 154(b) by 80 days.

(21) Appl. No.: 13/396,030

(22) Filed: Feb. 14, 2012

(65) Prior Publication Data

US 2013/0207274 A1 Aug. 15, 2013

(51) Int. Cl.
*H01L 23/48* (2006.01)
(52) U.S. Cl.
USPC .................................. 257/684; 257/E23.011
(58) Field of Classification Search
USPC ................. 257/629, 634, 650, 773, 776, 684, 257/E23.011
See application file for complete search history.

(56) References Cited

U.S. PATENT DOCUMENTS

| | | | |
|---|---|---|---|
| 7,067,397 B1 | 6/2006 | Chang-Chien et al. | |
| 7,372,408 B2 | 5/2008 | Gaucher et al. | |
| 7,504,721 B2 | 3/2009 | Chen et al. | |
| 7,518,229 B2 | 4/2009 | Cotte et al. | |
| 7,675,465 B2 | 3/2010 | Doan et al. | |
| 7,696,062 B2 * | 4/2010 | Chang-Chien et al. | 438/455 |
| 7,812,775 B2 | 10/2010 | Babakhani et al. | |
| 8,035,484 B2 * | 10/2011 | Kawae et al. | 340/10.1 |
| 8,362,599 B2 * | 1/2013 | Kim et al. | 257/660 |
| 2006/0276157 A1 | 12/2006 | Chen et al. | |

OTHER PUBLICATIONS

B.-W. Min et al., "A Low-Loss Silicon-on-Silicon DC-110-GHz Resonance-Free Package," IEEE Transactions on Microwave Theory and Techniques, Feb. 2006, pp. 710-716, vol. 54, No. 2,.
Y.A. Atesal et al."Millimeter-Wave Wafer-Scale Silicon BiCMOS Power Amplifiers Using Free-Space Power Combing," IEEE Transactions on Microwave Theory and Techniques, Apr. 2011, pp. 954-965 vol. 59, No. 4.
U.R. Pfeiffer et al., "A Chip-Scale Packaging Technology for 60-GHz Wireless Chipsets," IEEE Transactions on Microwave Theory and Techniques, Aug. 2006, pp. 3387-3397, vol. 54, No. 8.

* cited by examiner

*Primary Examiner* — William D Coleman
(74) *Attorney, Agent, or Firm* — Anne V. Dougherty; Ryan, Mason & Lewis, LLP

(57) ABSTRACT

Wafer-scale packaging structures and methods are provided for integrally packaging antenna structures with semiconductor RFIC (radio frequency integrated circuit) chips to form compact integrated radio/wireless communications systems for millimeter wave (mmWave) and Terahertz (THz) applications. For example, a chip package includes an RFIC chip, an antenna structure and an interface layer. The RFIC chip includes a semiconductor substrate having an active surface and an inactive surface, and a BEOL (back end of line) structure formed on the active surface of the semiconductor substrate. The antenna structure includes an antenna substrate and a planar antenna radiator formed on a surface of the antenna substrate, wherein the antenna substrate is formed of a low loss semiconductor material. The interface layer connects the antenna structure to the BEOL structure of the RFIC chip.

21 Claims, 12 Drawing Sheets

100

200

500

600

700

800

1100

WAFER-SCALE PACKAGE STRUCTURES WITH INTEGRATED ANTENNAS

TECHNICAL FIELD

The field generally relates to wafer-scale package structures with integrated antennas and, in particular, wafer-scale packaging structures and methods for integrally packaging antenna structures with semiconductor RFIC (radio frequency integrated circuit) chips to form compact integrated radio/wireless communications systems for millimeter wave (mm Wave) and Terahertz (THz) applications.

BACKGROUND

In a wireless network, the connectivity and communication between devices is achieved through the use of antennas that are coupled to receivers or transmitters, in order to radiate the desired signals to or from other elements of the network. In conventional radio communication systems, such as millimeter-wave radios, discrete components are usually assembled with low integration levels. These systems are often assembled using expensive and bulky waveguides and package-level or board-level microstrip structures to interconnect semiconductors and their required transmitter or receiver antennas. With recent progress in semiconductor technology and packaging engineering, the dimensions of these radio communication systems have become smaller.

With some state of the art technologies, multilayer integrated antenna structures can be fabricated using multilayered printed circuit boards (PCB) (organic-based) or using low temperature co-fired ceramic (LTCC) technology (ceramic-based). These multilayered organic or ceramic integrated antenna structures can be connected to semiconductor IC chips using standard C4 (controlled collapse chip connection) techniques. Integrated antenna structures that are made with organic or ceramic-based packaging techniques are generally suitable for application operating frequencies in the 60 GHz band, and even up to the 94 GHz band, while achieving suitable performance. However, for operating frequencies in the 94 GHz band and above, the use of above organic or ceramic-based multilayer antenna structures becomes problematic due to, e.g., low PCB and LTCC manufacture resolutions. Moreover, the package materials used for PCB and LTCC technologies are too lossy for high frequency applications. Thus, it is desirable to design package structures with integrated antennas coupled to semiconductor IC chips (e.g., RFIC chips) that provide high performance operation for applications with operating frequencies up to the THz range.

SUMMARY

In general, exemplary embodiments of the invention include wafer-scale package structures with integrated antennas and, in particular, wafer-scale packaging structures and methods for integrally packaging antenna structures with semiconductor RFIC chips to form compact integrated radio/wireless communications systems for millimeter wave and Terahertz applications.

In one exemplary embodiment, a chip package includes an RFIC chip, an antenna structure and an interface layer. The RFIC chip includes a semiconductor substrate having an active surface and an inactive surface, and a BEOL (back end of line) structure formed on the active surface of the semiconductor substrate. The antenna structure includes an antenna substrate and a planar antenna radiator formed on a surface of the antenna substrate, wherein the antenna substrate is formed of a low loss semiconductor material. The interface layer connects the antenna structure to the BEOL structure of the RFIC chip. The low loss semiconductor material may be high resistivity silicon, silica or quartz, for example.

In another exemplary embodiment, an apparatus includes a chip package and a circuit board, wherein the chip package is mounted to the circuit board. The chip package includes an RFIC chip, an antenna structure and an interface layer. The RFIC chip includes a semiconductor substrate having an active surface and an inactive surface, and a BEOL (back end of line) structure formed on the active surface of the semiconductor substrate. The antenna structure includes an antenna substrate and a planar antenna radiator formed on a surface of the antenna substrate, wherein the antenna substrate is formed of a low loss semiconductor material. The interface layer connects the antenna structure to the BEOL structure of the RFIC chip. The low loss semiconductor material may be high resistivity silicon, silica or quartz, for example. The apparatus further includes electrical interconnect structures providing DC supply, ground, control and I/O baseband signal lines between the RFIC chip and the circuit board.

These and other exemplary embodiments, aspects, and features of the present invention will be described or become apparent from the following detailed description of exemplary embodiments, which is to be read in connection with the accompanying drawings.

DETAILED DESCRIPTION OF EXEMPLARY EMBODIMENTS

Exemplary embodiments of the invention will now be discussed in further detail with regard to wafer-scale packaging structures and methods for integrally packaging antenna structures with semiconductor RFIC (radio frequency integrated circuit) chips to form compact integrated radio/wireless communications systems for millimeter wave (mm-Wave) applications (e.g., 94 GHz) and Terahertz (THz) applications (e.g., 300 GHz to 3 Terahertz). In general, package structures according to exemplary embodiments of the invention include antenna structures that are fabricated using silicon or thin-film manufacturing processes, and which are integrally packaged with RFIC chips using wafer-scale manufacturing technologies. In the exemplary embodiments of package structure that will be discussed in detail below with reference to FIGS. 1-12, the package structures generally include an RFIC (radio frequency integrated circuit) chip, an antenna structure and an interface layer. The RFIC chip includes a semiconductor substrate having an active surface and an inactive surface, and a BEOL (back end of line) structure formed on the active surface of the semiconductor substrate. The antenna structure includes an antenna substrate and a planar antenna radiator formed on a surface of the antenna substrate, wherein the antenna substrate is formed with one or more antenna substrate layers, wherein the antenna substrate layers are formed of a low loss semiconductor material such as high resistivity silicon (or low loss silicon), silica, quartz, or other suitable semiconductor materials. The interface layer connects the antenna structure to the BEOL structure of the RFIC chip.

It is to be understood that the various layers and/or regions shown in the accompanying Figures are not drawn to scale, and that one or more layers and/or regions of a type commonly used in integrated chip packages may not be explicitly shown in a given Figure. This does not imply that the layers and/or regions not explicitly shown are omitted from the actual integrated chip packages. Moreover, the same or similar reference numbers used throughout the Figures are used to denote the same or similar features, elements or structures, and thus, a detailed explanation of the same or similar features, element or structures will not be repeated for each of the Figures.

Figure 1:
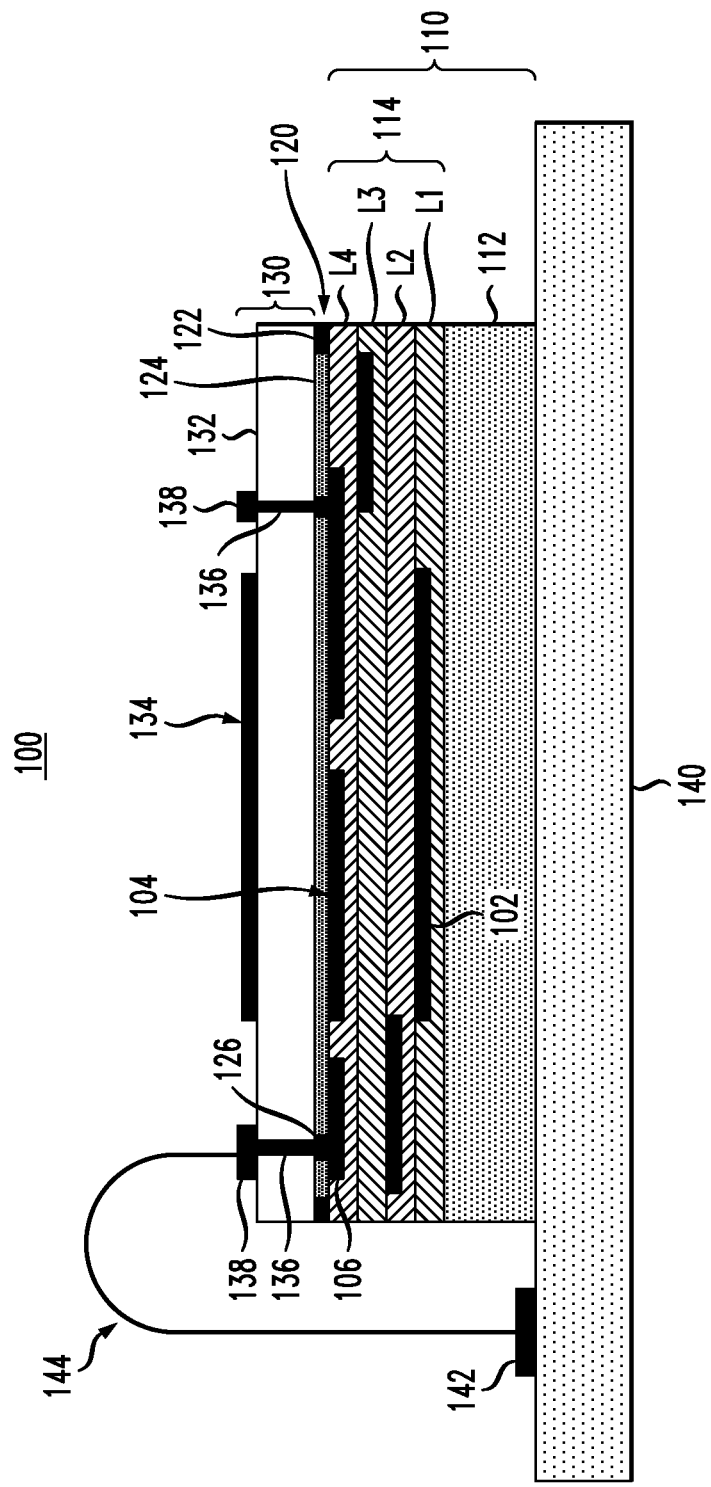
FIG. 1 schematically depicts a package structure comprising an antenna structure and integrated circuit chip, according to an exemplary embodiment of the invention.

FIG. 1 schematically depicts a package structure comprising an antenna structure and integrated circuit chip, according to an exemplary embodiment of the invention. In particular, FIG. 1 is a side schematic view of a package structure 100 comprising an RFIC chip 110, an interface layer 120, an antenna structure 130, and an application board 140 (or circuit board). The RFIC chip 110 comprises a semiconductor substrate 112 (e.g., a low resistivity silicon substrate) and a BEOL (back end of line) structure 114 having a plurality of inter-level layers (e.g., layers L1, L2, L3 and L4) of dielectric and metallization layers. The antenna structure 130 generally comprises at least one substrate layer 132, a planar antenna 134 structure (or antenna radiator) formed on a top surface of the substrate 132, a plurality of through vias 136 formed through the substrate 132, and a plurality of contact pads 138 formed on the top surface of the substrate 132.

As depicted in the exemplary embodiment of FIG. 1, the antenna radiator 134 may be an electromagnetic-coupled patch antenna, wherein an antenna ground plane 102 and antenna feed line 104 are metallization structures formed as part of the BEOL structure 114 of the RFIC chip 110. In particular, as shown in FIG. 1, the antenna ground plane 102 is a metallization structure formed in a first (bottom) layer L1 of the BEOL structure 114 of the RFIC chip 110, and the antenna feed line 104 is a metallization structure formed on the last (top) layer L4 of the BEOL structure 114 of the RFIC chip 110. The antenna feed line 104 may be a micro strip line or co-planar waveguide line, for example, which is electromagnetically coupled to the antenna radiator 134, wherein the ground plane 102 also serves as a ground plane for the antenna feed line 104.

The low loss antenna substrate 132 is formed of a low loss semiconductor substrate material such as high resistivity silicon (e.g., >1000 Ohm·cm), silica, quartz, or other materials suitable for wafer-scale manufacturing. The dielectric constant and thickness of the substrate 132 will determine antenna performance parameters such as antenna radiation efficiency and bandwidth. For example, for a 94 GHz operating frequency, the substrate 132 can be made of a low loss silicon substrate having a thickness of about 50 microns. The size and structure of the antenna radiator 134 will determine the resonant frequency of the antenna, as is well understood to those of ordinary skill in the art.

The substrate 112 of the RFIC chip 110 comprises the active circuit elements formed on an active surface thereof. The active circuit elements may form a receiver, a transmitter or a transceiver circuit, and other active or passive circuit elements that are commonly used to implement wireless RFIC chips. The various layers of the BEOL structure 114 may be formed with commonly used dielectric or insulating material such as silicon oxide, with metallization structures formed of copper or gold or other commonly used metallic or conductor materials to implement BEOL structures in wafer scale manufacturing. The overall thickness of the RFIC chip 110 may be in a range from about 150 microns to about 700 microns, depending of the application requirements. This thickness is determined by, e.g., how the chip interfaces with the chip package or application board.

The antenna substrate 132 is attached to the RFIC chip 110 via the interface layer 120, which comprises a plurality of micro metal stubs or balls 122/126 reinforced with under fill material 124. The micro metal stubs or balls 122/126 may include passive metal connecting pads or rings 122 that are used to bond the antenna substrate 132 to the RFIC chip 110, or active metal pads 126 that provide electrical connections between metal traces 106 of the top layer L4 of the BEOL structure 114 and metallic through vias 136 that connect to contact pads 138 on the top surface of the antenna substrate 132.

The contact pads 138 on the surface of the substrate 132 serve as connections to contact pads 142 on the application board 140 (e.g., printed circuit board). The contact pads 142 may be ground pads, DC power supply pads, input/output pads, control signal pads, etc. The contact pads 142 on the application board 140 are wire bonded to the contact pads 138 on the antenna substrate 132 using wire bonds 144. In this regard, the RFIC chip/antenna package 110/130 is connected to the application board 140 through wire bonds 144, wherein all mmWave or THz frequency signals are contained in the RFIC package, and only low frequency signals, such as DC power supply, control and baseband signals, pass through the wire bonds 144.

Figure 2:
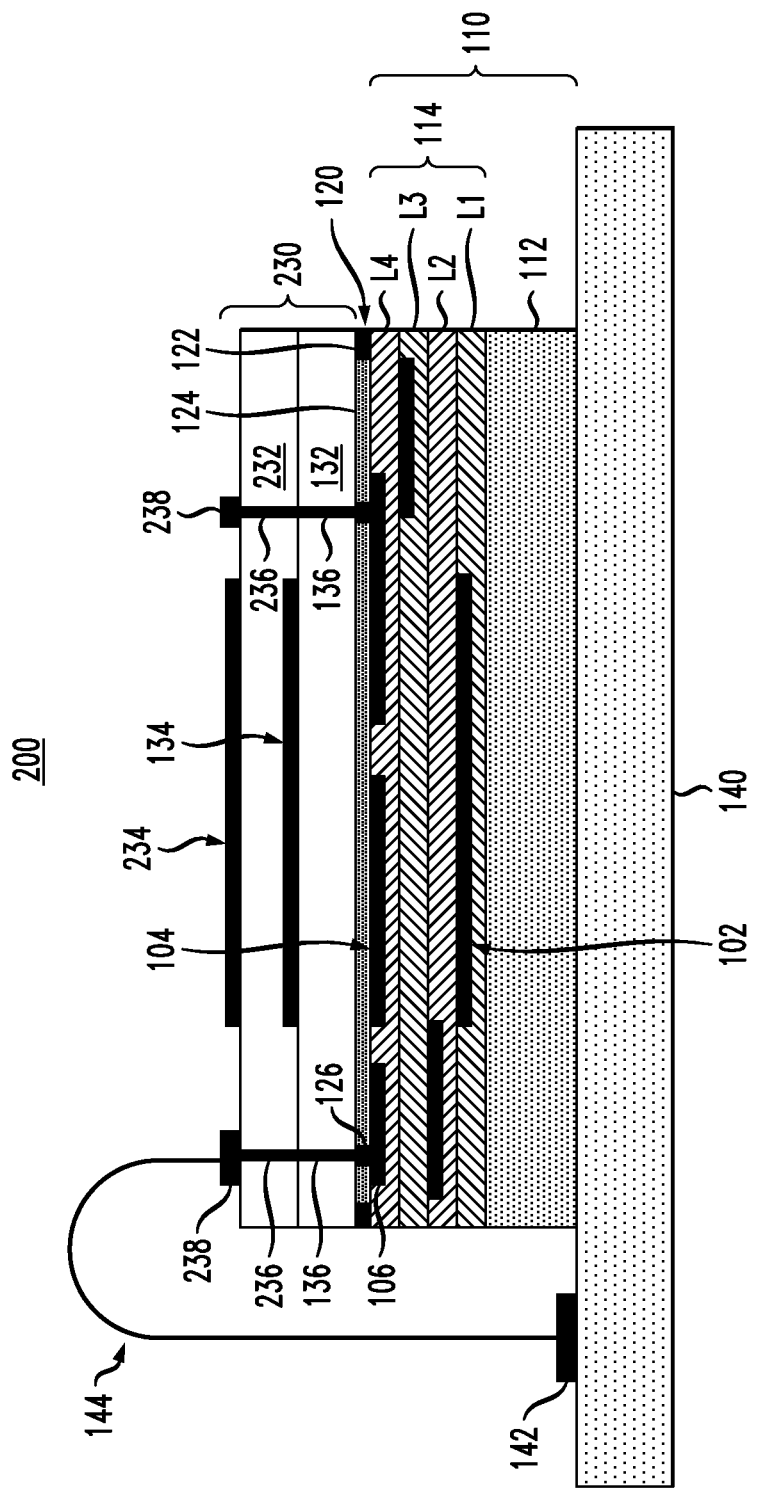
FIG. 2 schematically depicts a package structure comprising an antenna structure and integrated circuit chip, according to another exemplary embodiment of the invention.

It is to be appreciated that principles of the invention as discussed above with reference to FIG. 1 can be extended to other package designs. For instance, FIG. 2 schematically depicts a package structure comprising an antenna structure and integrated circuit chip, according to another exemplary embodiment of the invention. In particular, FIG. 2 is a side schematic view of a package structure 200, which is similar to the package structure 100 of FIG. 1, except that the package structure 200 of FIG. 2 includes a multi-layer antenna structure 230 forming an electromagnetic-coupled stacked patch antenna structure. In particular, the antenna structure 230 comprises a first substrate 132 with a first antenna radiator 134 (e.g., patch antenna) and through vias 136 (similar to FIG. 1) as well as a second substrate 232 having through vias 236 and a second antenna radiator 234 e.g., patch antenna) and contact pads 238 formed on a top surface thereof.

In the exemplary embodiment of FIG. 2, the use of two patch radiators 134/234 serves to increase the antenna bandwidth (as compared to the single patch structure of FIG. 1), which is required in certain applications. The two antenna substrates 132 and 232 can be formed of the same material or different materials. For instance, the first substrate layer 132 may be formed of glass (silica) and the second substrate 232 may be formed of low loss silicon, providing two low loss substrates with different dielectric constants (silica has a lower dielectric constant than silicon). The materials with different losses and dielectric constants can be implemented to tune the operating frequency/bandwidth of the stacked patch antenna structure, using methods known to those of ordinary skill in the art.

Similar to the package structure of FIG. 1, the contact pads 238 on the surface of the second substrate 232 serve as connections to contact pads 142 on the application board 140 (e.g., printed circuit board). The contact pads 142 may be ground pads, DC power supply pads, input/output pads, control signal pads, etc. The contact pads 142 on the application board 140 are wire bonded to the contact pads 238 on the antenna substrate 232 using wire bonds 144. The through vias 126 and 236 formed in the different antenna substrates 132 and 232 are formed in alignment with each other to provide electrical connections between the metal traces 106 of the top layer L4 of the BEOL structure 114 and the contact pads 238 on the top surface of the antenna substrate 232.

The exemplary embodiments of FIGS. 1 and 2 illustrate antenna structures with electromagnetic-coupled patch antennas and stacked patch antenna structures. These designs can be extended to include other types of radiators such as planar slot antenna structure or planar slot ring antenna structures. In such embodiments, the radiators 134 and 234 of FIGS. 1 and 2 are implemented as thin metallic plates having apertures formed therein that define slots or slotted rings, as is known in the art. These metal plates used to form the slot or slot-ring antenna structures can further serve as heat sinks to dissipate heat generated by the RFIC chip 110.

Figure 3:
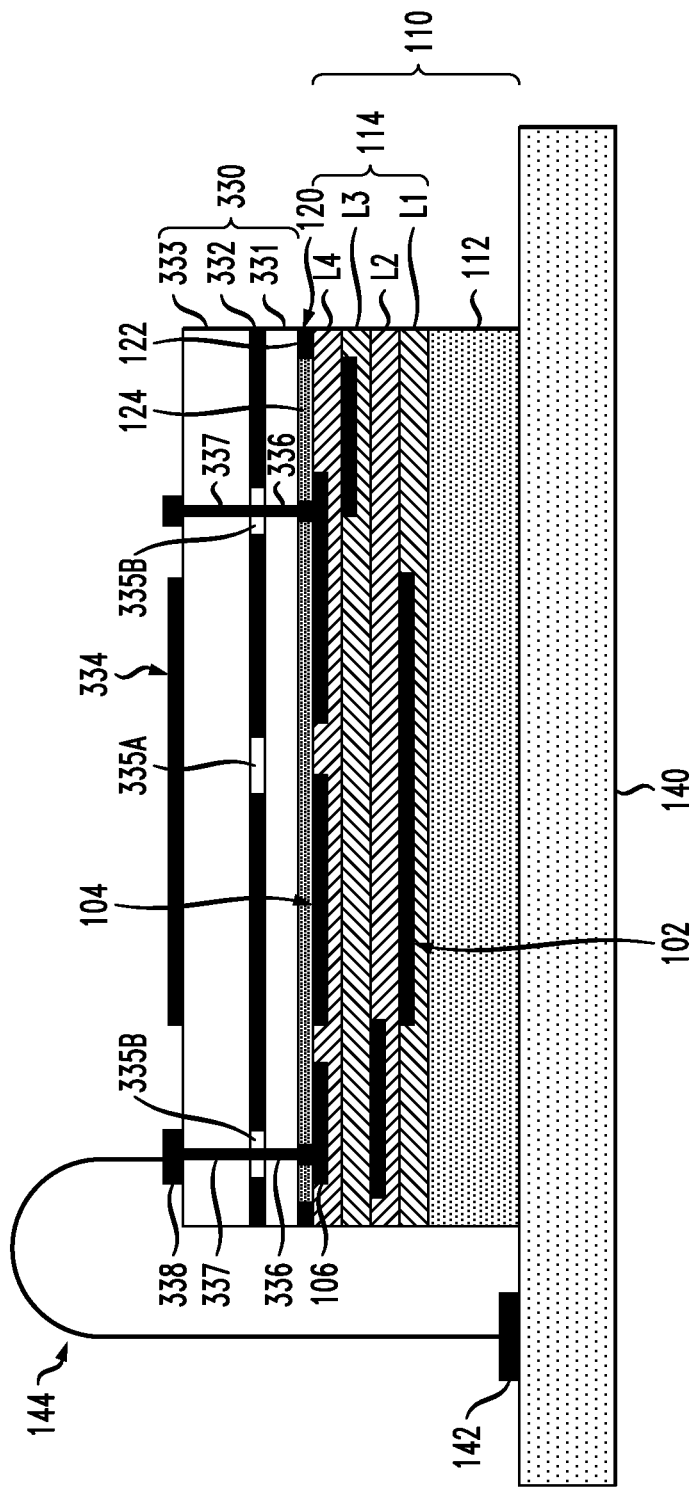
FIG. 3 schematically depicts a package structure comprising an antenna structure and integrated circuit chip, according to another exemplary embodiment of the invention.

Moreover, since wafer-scale manufacturing technologies are used to fabricate chip packages according to principles of the invention, fine pitch metal structures can be realized fabricated in the package designs, allowing for patch antennas with probe-feed and aperture-feed to be implemented in the package as well. For instance, FIG. 3 schematically depicts a package structure comprising an antenna structure and integrated circuit chip, according to another exemplary embodiment of the invention, which implements an aperture-coupled antenna design. In particular, FIG. 3 is a side schematic view of a package structure 300 which is similar to the package structure 200 of FIG. 2, except that the package structure 300 of FIG. 3 includes a multi-layered antenna structure 330 forming an aperture-coupled patch antenna.

In particular, the antenna structure 330 comprises a first substrate 331 layer, an antenna ground plane 332, a second substrate layer 333, and a patch radiator 334. The ground plane 332 comprises a plurality of apertures 335A and 335B. In contrast to the package structures of FIGS. 1 and 2, the antenna ground plane 332 is formed as part of the antenna structure 330, and not as part of the BEOL structure 114 of the RFIC chip. 110. As shown in FIG. 3, the ground plane 102 formed on the first level L1 of the BEOL 114 serves as a ground plane for the antenna feed line 104. In the exemplary embodiment of FIG. 3, electromagnetic energy is coupled between the antenna feed line 104 and the antenna radiator 334 through the aperture 335A formed in the ground plane 332. Moreover, conductive through vias 336 and 337 formed in the first and second antenna substrates 331 and 333 pass through the apertures 335B formed in the antenna ground plane 332, forming electrical connections between the metal traces 106 of the top layer L4 of the BEOL structure 114 and contact pads 338 on the top surface of the antenna substrate 333.

By implementing the antenna ground plane 332 within the antenna package structure 330 of FIG. 3 (as compared to implementing the antenna ground plane 102 in the BEOL structure 114 as shown in with FIGS. 1 and 2), the antenna radiator 334 is separated from the antenna feed line 104 by the antenna ground plane 332. This allows the antenna radiators and the feeding structures to be essentially optimized independently of each other. The aperture-coupled package design of FIG. 3 can be extended to an aperture-coupled stacked patch antenna design (as described below with reference to FIG. 4) and a probe-feed patch antenna design (as discussed below with reference to FIG. 5).

Figure 4:
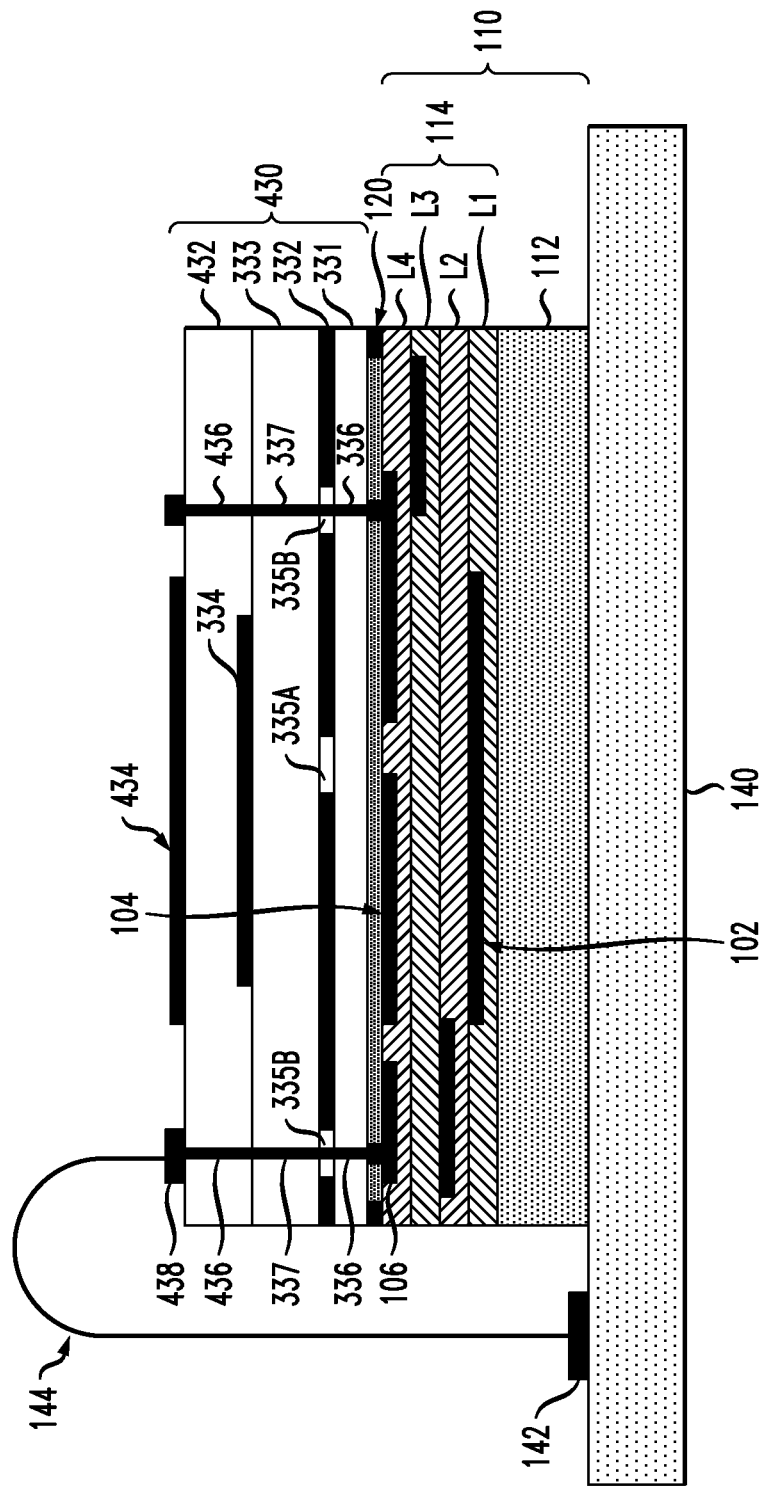
FIG. 4 schematically depicts a package structure comprising an antenna structure and integrated circuit chip, according to another exemplary embodiment of the invention.

FIG. 4 schematically depicts a package structure according to another exemplary embodiment of the invention, which implements an aperture-coupled stacked patch antenna design. In particular, FIG. 4 is a side schematic view of a package structure 400 which is similar to the package structure 300 of FIG. 3, except that the package structure 400 of FIG. 4 includes a multi-layered antenna structure 430 which includes an additional antenna substrate layer 432 with a second patch radiator 434 formed on a surface thereof, and additional through vias 436 formed through the substrate 432 connecting the lower through vias 337 and 336 in the lower antenna substrate layers 333 and 331 to conductive pads 438 formed on the upper surface of the antenna substrate layer 432. The stacked patch antenna design of FIG. 4, which includes a first patch radiator 334 on antenna substrate 333 with a second patch radiator 343 formed on antenna substrate 432, provides for improved bandwidth of operation. The upper radiator patch 434 may be formed wider than the lower radiator patch 334 to allow for efficient coupling of electromagnetic energy between the patch radiators 334/434 and the antenna feed line 104 through the aperture 335A formed in the antenna ground plane 332, and to allow for tuning of the antenna bandwidth.

Figure 5:
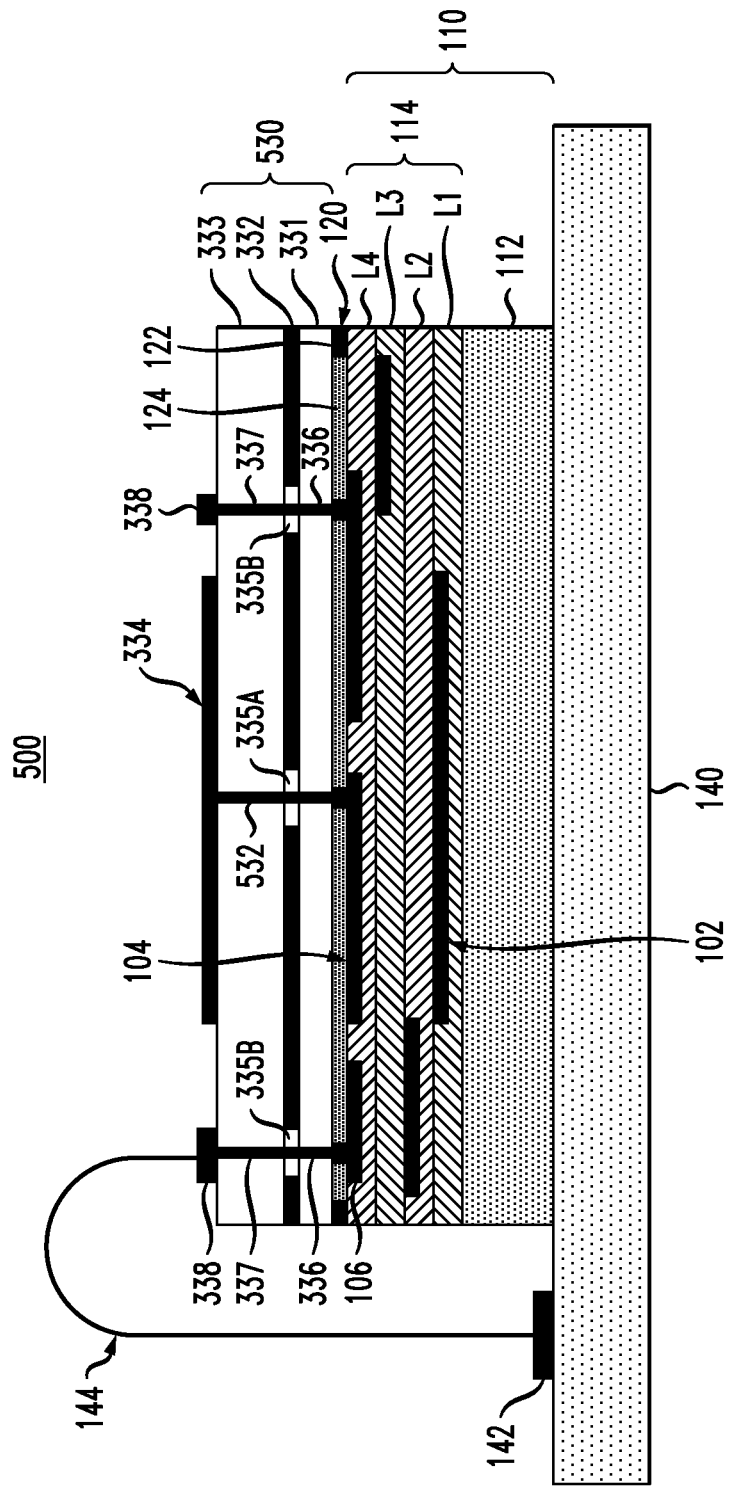
FIG. 5 schematically depicts a package structure comprising an antenna structure and integrated circuit chip, according to another exemplary embodiment of the invention.

FIG. 5 schematically depicts a package structure according to another exemplary embodiment of the invention, which implements a probe-fed patch antenna design. In particular, FIG. 5 is a side schematic view of a package structure 500 which is similar to the package structure 300 of FIG. 3, except that the package structure 500 of FIG. 5 includes a multi-layered antenna structure 530 which includes a vertical feed probe 532 that is formed through the antenna layers 331, 332, and 332 connecting the antenna feed line 104 to the patch radiator 334 formed on the surface of the antenna substrate 333. The vertical feed probe 532 connected to an end of the feed line 104 serves as a vertical transition that extends through the aperture 335A of the ground plane 332 to couple energy from the antenna feed line 104 to the patch radiator 334.

Figure 6:
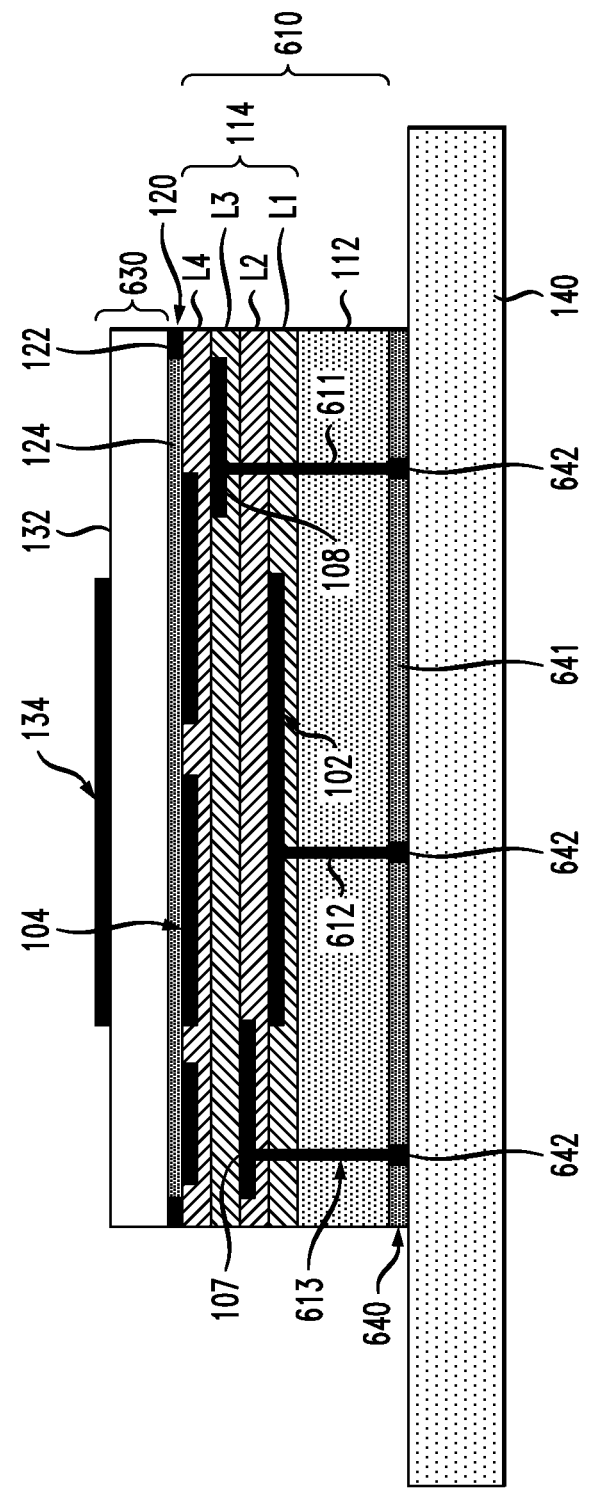
FIG. 6 schematically depicts a package structure comprising an antenna structure and integrated circuit chip, according to another exemplary embodiment of the invention.

FIG. 6 schematically depicts a package structure according to another exemplary embodiment of the invention, which implements a TSV (Through-Silicon-Via) design. In particular, FIG. 6 is a side schematic view of a package structure 600 which is similar to the package structure 100 of FIG. 1, except that the package structure 600 of FIG. 6 includes an RFIC chip 610 having plurality of conductive through-silicon-vias 611, 612 and 613 which are formed through the semiconductor substrate 112 of the RFIC ship 610. A bottom layer 640 of the RFIC chip 610 comprises an insulating layer 641 (or passivation layer) and a plurality of contact pads 642 formed on an inactive surface of the RFIC chip 610. The contact pads 642 may be bonded to corresponding contacts (not shown) formed on the application board 140 using solder balls (e.g., C4 connections). In the exemplary embodiment of FIG. 6, the through-silicon-vias 611, 612, and 613 provide electrical connections between the bottom contact pads 642 and metallic traces 108, 102 and 107, respectively, formed on the various levels of the BEOL 114.

In particular, the silicon-through via 612 provides an electrical connection between the ground plane 102 on the first level L1 of the BEOL 114 to a contact pad 642, providing a ground connection between the RFIC chip 610 and the application board 140. The silicon-through via 611 provides an electrical connection between a metal trace 108 formed on the third level L3 of the BEOL 114 to a contact pad 642 providing a DC supply, or control or I/O baseband signal connection between the RFIC chip 610 and the application board 140. Similarly, the silicon-through via 613 provides an electrical connection between a metal trace 107 formed on the second level L2 of the BEOL 114 to a contact pad 642 providing a DC supply, or control or I/O baseband signal connection between the RFIC chip 610 and the application board 140. In contrast to the antenna package layer 130 of FIG. 1, an antenna package layer 630 in FIG. 6 does not include any conductive through vias within the antenna substrate 132. Instead, \with the package design of FIG. 6, all DC supply, ground, control and I/O baseband signal lines are implemented with the RFIC 610.

FIGS. 1-6 illustrate exemplary embodiments in which the footprint sizes of the RFIC chips and antenna package structures are the same or substantially similar. In other exemplary embodiments of the invention as discussed below with reference to FIGS. 7-12, the footprint sizes of the RFIC chip and the antenna package structures are different, allowing for different approaches for packaging and wiring. For example, in applications where the footprint size of the RFIC size is greater than the footprint size of the antenna package, low frequency wire bonds can be attached to a top surface of the RFIC chip and also a top surface of the antenna package.

Figure 7:
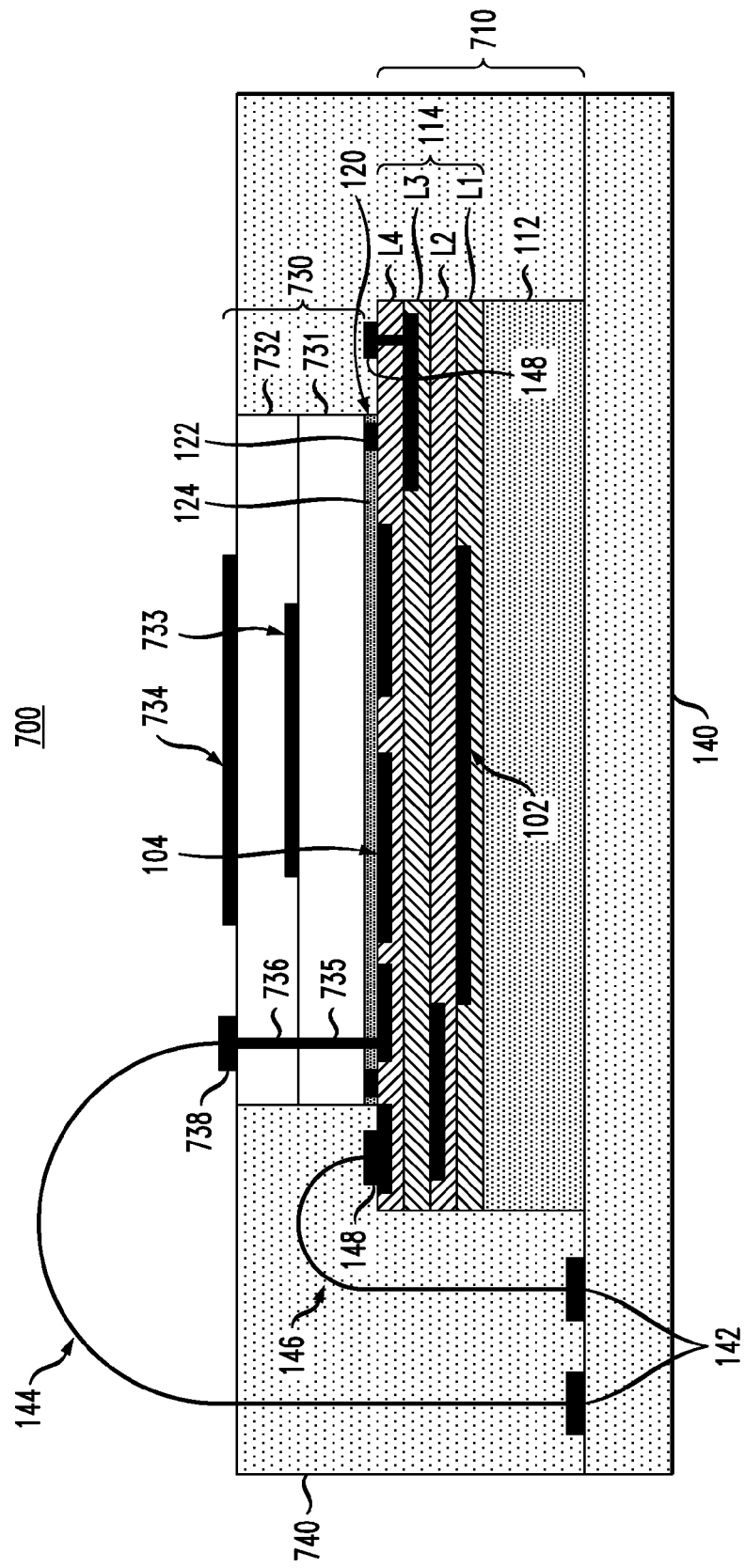
FIG. 7 schematically depicts a package structure comprising an antenna structure and integrated circuit chip, according to another exemplary embodiment of the invention.

In particular, FIG. 7 schematically depicts a package structure comprising an antenna structure and integrated circuit chip, according to another exemplary embodiment of the invention, in which an RFIC chip has a larger footprint size than an antenna structure. More specifically, FIG. 7 depicts a side schematic view of a package structure 700 comprising an RFIC chip 710 and antenna structure 730, which is smaller in size than the RFIC chip 710. The package structure 700 of FIG. 7 is similar to the package structure 200 of FIG. 2 in that the package structure 700 includes a multi-layered antenna structure forming an electromagnetic-coupled stacked patch antenna structure. In particular, the antenna structure 730 comprises a first substrate 731 with a first patch radiator 733 and through vias 735, as well as a second substrate 732 having through vias 736 and a second patch radiator 734 and contact pads 738 formed on a top surface thereof. The antenna substrates 731/732 are smaller in footprint size than the RFIC chip 710 such that peripheral regions of the top surface of the RFIC chip 710 are not covered by the antenna structure 730.

In this design, additional contact pads 148 can be formed on the exposed peripheral regions of the upper surface of the RFIC chip 710, and wire bond connections 146 can be formed between the contact pads 148 on the top surface of the RFIC chip 710 and contact pads 142 on the application board, to thereby provide direct DC supply, or control or I/O baseband signal connections between the RFIC chip 710 and the application board 140. If the exposed area on the upper surface of the RFIC chip 710 is limited, then additional wire bond connections 144 can be formed between the contact pads 738 on the top surface of the antenna substrate 732 and the contact pads 142 on the application board 140, to thereby provide additional DC supply, or control or I/O baseband signal connections. In other exemplary embodiments of the invention, a glob top (protective) layer 740 can be added to the package structure 700 to protect the exposed surface regions of the RFIC chip 710.

FIGS. 8-11 depict various exemplary embodiment of package structures in which the footprint size of the antenna structure is larger than the footprint size of the RFIC chip. The footprint size of the antenna structure may be larger than the footprint size of the RFIC chip in instances, for example, where the antenna structure comprises a plurality of radiators forming an array antenna or where the operating frequency of the antenna is relatively low (in which case larger planar antenna structures are constructed for the desired lower resonant frequencies).

Figure 8:
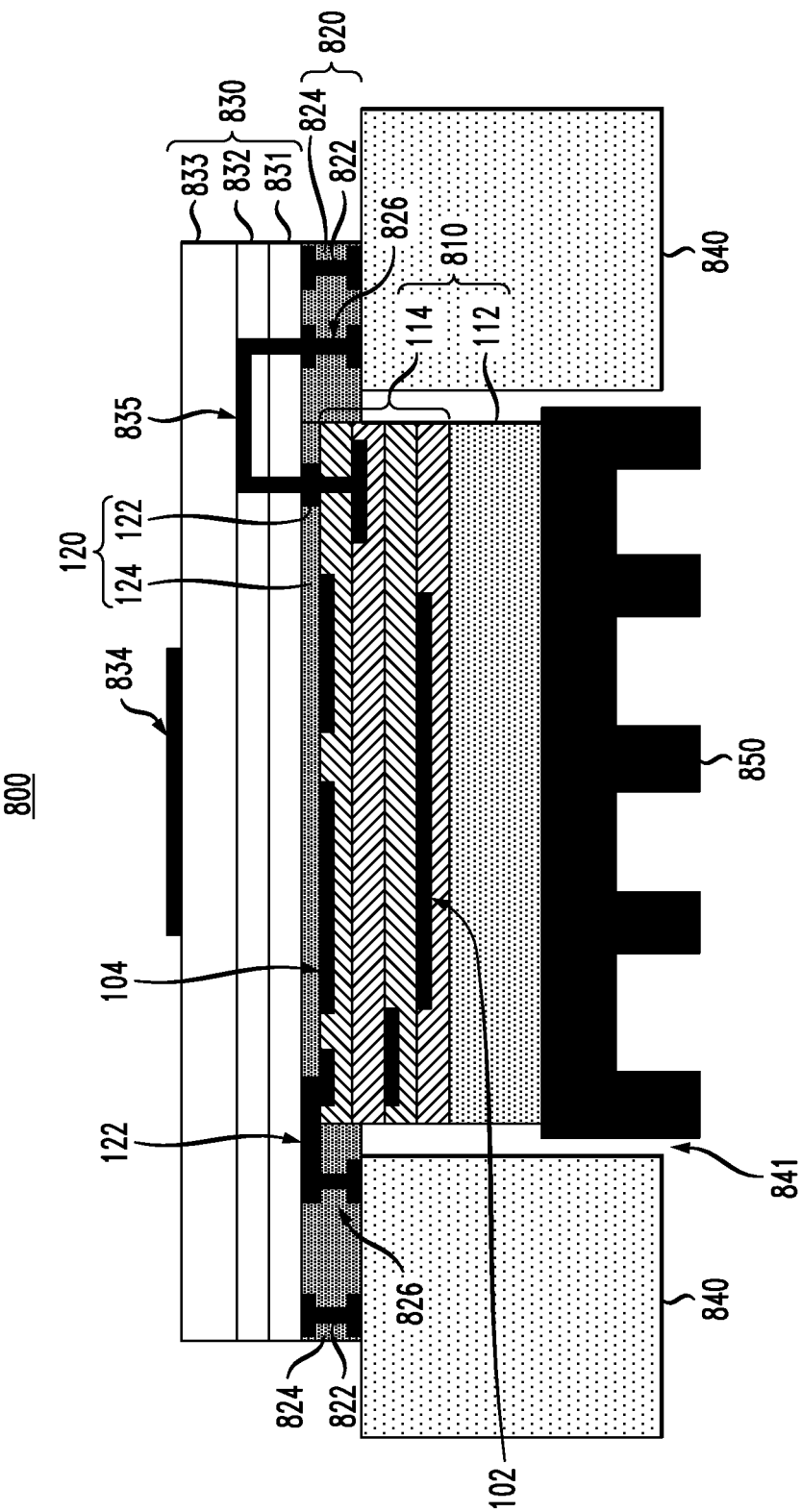
FIG. 8 schematically depicts a package structure comprising an antenna structure and integrated circuit chip, according to another exemplary embodiment of the invention.

By way of example, FIG. 8 schematically depicts one exemplary embodiment of a package structure 800 with an RFIC chip 810 having a footprint size that is smaller than a footprint size of an antenna structure 830. In general, similar to FIG. 1, the package structure 800 of FIG. 8 comprises an electromagnetic-coupled patch antenna design. The antenna structure 830 comprises a plurality of antenna substrates 831, 832 and 833 with a patch radiator 834 formed on a top surface of the antenna substrate 833. The antenna substrates 831, 832, 833 extend past the side walls of the RFIC chip 810, thereby allowing the antenna package 830 to be attached to an application board 840 through an interface layer 820.

In one exemplary embodiment of the invention, the interface 820 comprises a BGA (ball grid array) interface comprising a plurality of BGA connections 822, 826, encapsulated in under fill material 824. Some BGA connections 822 are non-electrical connections which are implemented to bond the antenna structure 830 to a surface of the application board 840. Other BGA connections 826 also serve as electrical connections between the application board 840 and the RFIC chip 810. For instance, as shown in FIG. 8, some BGA connections 826 are connected to metal traces 122 that are formed as part of the interface layer 120 between the RFIC chip 810 and the antenna structure 830, and metal traces 835 that are formed by vias and metal lines formed in various substrate layers 831 and 832 of the antenna structure 830, thereby providing direct DC supply, or control or I/O baseband signal connections between the RFIC chip 810 and the application board 840.

Figure 9:
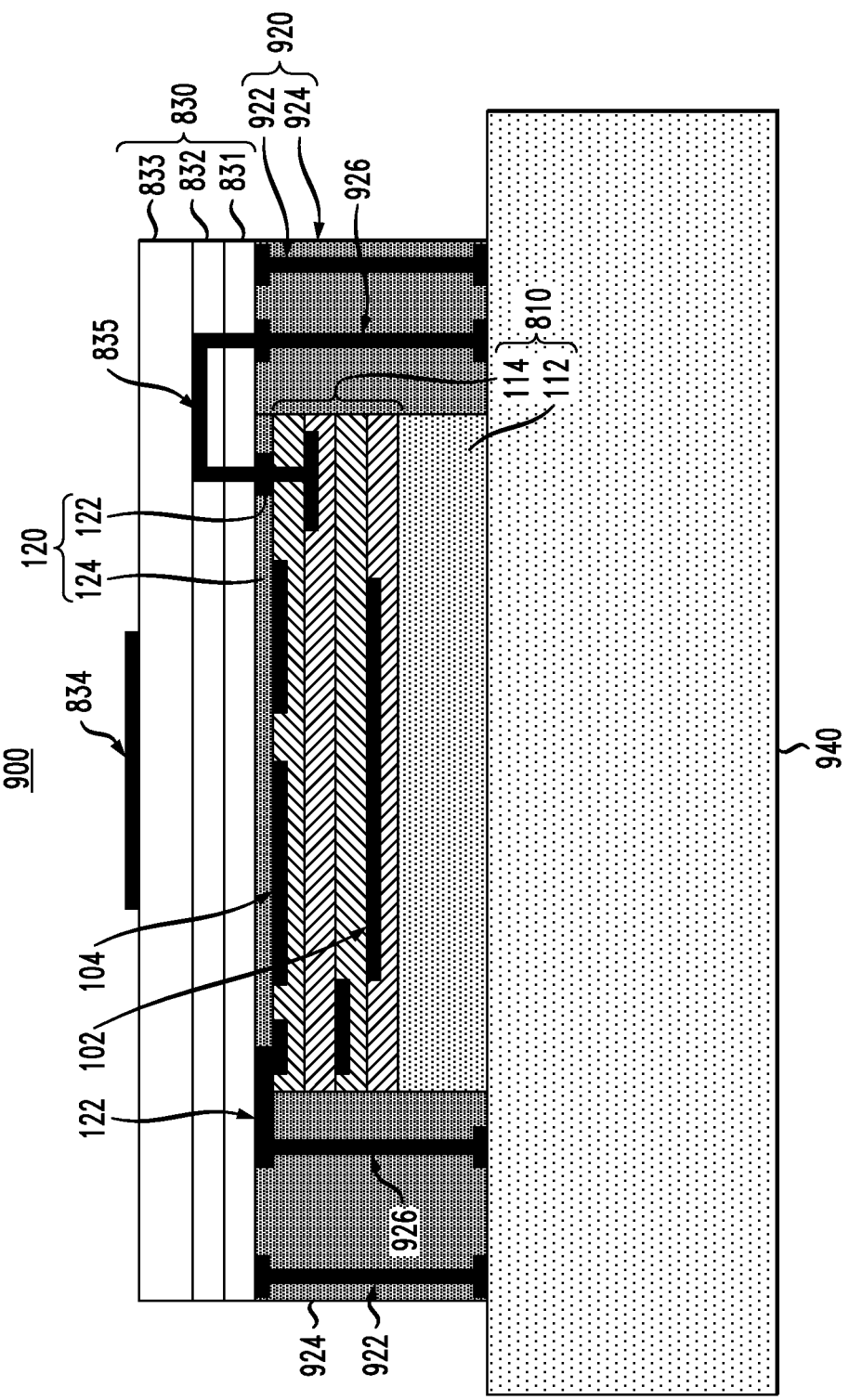
FIG. 9 schematically depicts a package structure comprising an antenna structure and integrated circuit chip, according to another exemplary embodiment of the invention.

The application board 840 may be formed with an opening 841 which insertably receives the RFIC chip 810. Moreover, with the opening 841 formed in the application board 840, an optional heat sink 850 can be attached to the non-active surface of the semiconductor substrate 112 of the RFIC chip 810, to provide means for dissipating heat generated by the RFIC chip 810. In other exemplary embodiments of the invention, such as depicted in FIG. 9, an application board 940 may not have an opening formed therein. In this instance, the BGA interface 920 between the antenna structure 830 and the application board 940 includes BGA connections 924, 926, and an under fill layer 924 that are thick enough (e.g., 350 um in thickness being adequate for most applications) to provide properly bond/connect the antenna structure 830 and the application board 940.

Figure 10:
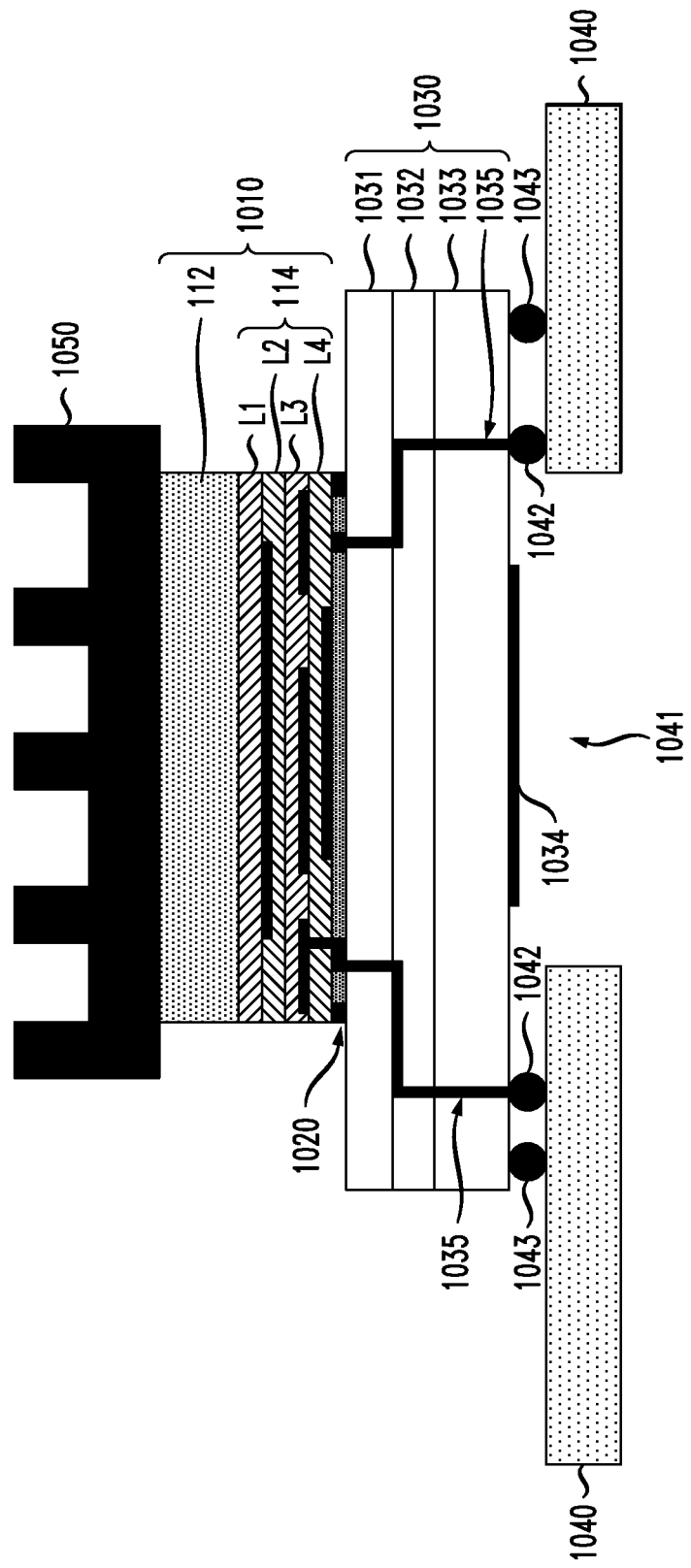
FIG. 10 schematically depicts a package structure comprising an antenna structure and integrated circuit chip, according to another exemplary embodiment of the invention.
Figure 11:
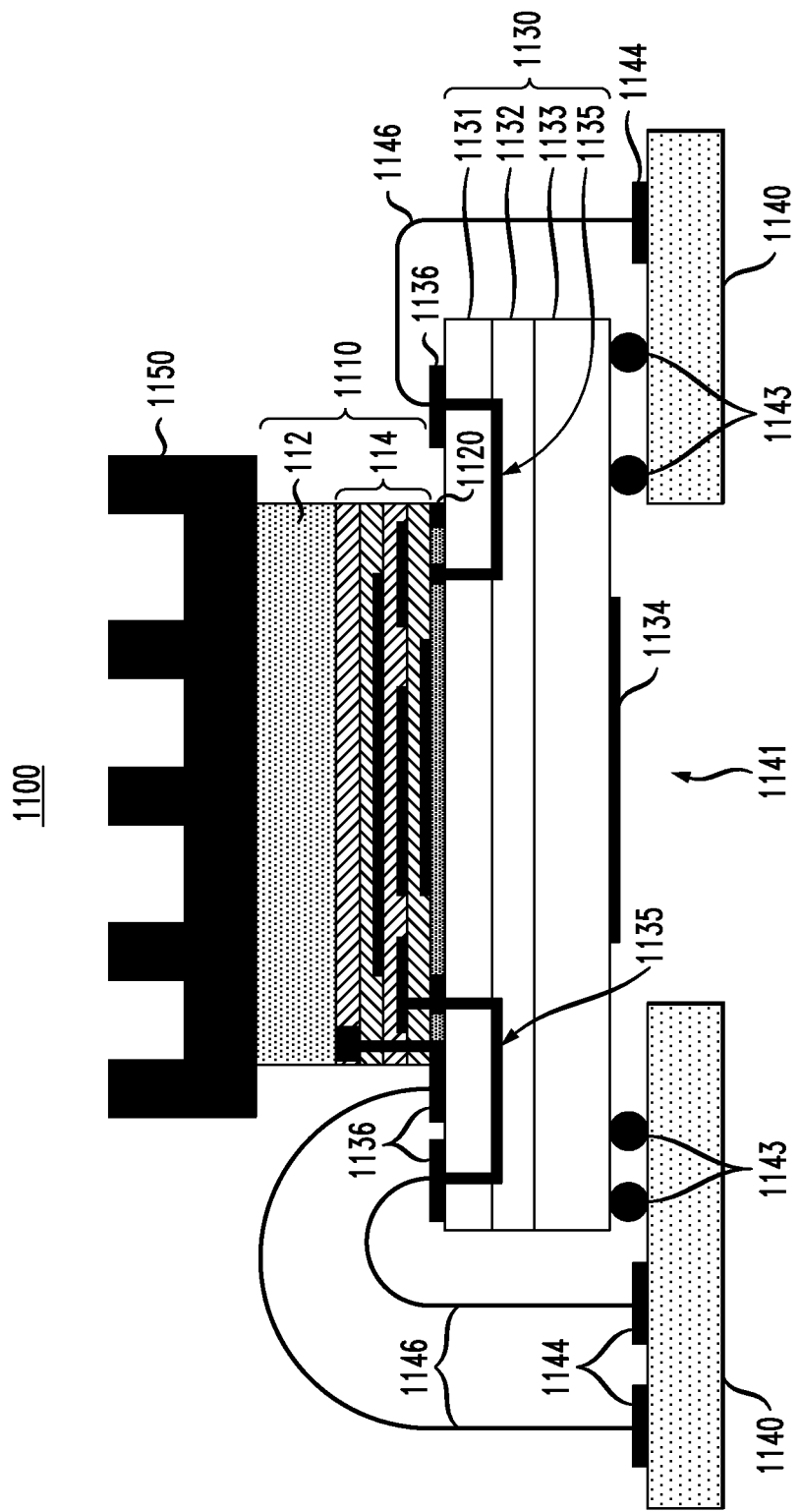
FIG. 11 schematically depicts a package structure comprising an antenna structure and integrated circuit chip, according to another exemplary embodiment of the invention.

With package design methodologies as described herein, an RFIC package with an integrated antenna can be attached upside-down through a BGA interface to an application board with an opening formed in the application board to provide a window for antenna radiation. Exemplary embodiments of these structures are depicted in FIGS. 10 and 11. In particular, FIG. 10 schematically depicts one exemplary embodiment of a package structure 1000 with an RFIC chip 1010 having a footprint size that is smaller than a footprint size of an antenna structure 1030, which is similar to the structure of FIG. 8, but wherein the package 1000 is inverted. The package structure 1000 comprises an electromagnetic-coupled patch antenna design. The antenna structure 1030 comprises a plurality of antenna substrates 1031, 1032 and 1033 with a patch radiator 1034 formed on a surface of the antenna substrate 1033. The antenna 1010 is connected to the RFIC chip 1010 through an interface layer 1020 which is similar in structure to the interface layers in other embodiments discussed above. An optional heat sink 1050 can be attached to the non-active surface of the semiconductor substrate 112 of the RFIC chip 1010, to provide means for dissipating heat generated by the RFIC chip 1010.

The package 1000 is attached upside down to an application board 1040 using a BGA interface 1042/1043, with the patch radiator 1034 of the antenna structure 1030 aligned to an opening 1041 formed in the application board 1040. This opening 1041 provides a widow for the antenna radiator 1034 to emit and capture electromagnetic radiation. In one exemplary embodiment of the invention, the interface 1042/1043 comprises a plurality of BGA connections encapsulated in under fill material. Some BGA connections 1043 are non-electrical connections which are implemented to bond the antenna structure 1030 to a surface of the application board 1040. Other BGA connections 1042 also serve as electrical connections between the application board 1040 and the RFIC chip 1010. For instance, as shown in FIG. 10, the BGA connections 1042 are connected to conductive interconnects 1035 (including a series of conductive through vias and metal traces) that are formed as part of the antenna substrate layers 1031, 1032 and 1033 between the RFIC chip 1010 and the application board 1040. These conductive interconnects 1035 provide direct DC supply, or control or I/O baseband signal connections between the RFIC chip 1010 and the application board 1040.

FIG. 11 schematically depicts another exemplary embodiment of a package structure 1100 with an RFIC chip 1110 having a footprint size that is smaller than a footprint size of an antenna structure 1130, which is similar to the structure of FIG. 10, but wherein wire bonding is used to provide direct DC supply, or control or I/O baseband signal connections between the RFIC chip 1110 and an application board 1140. As shown in FIG. 11, the package structure 1100 comprises an electromagnetic-coupled patch antenna design, wherein the antenna structure 1130 comprises a plurality of antenna substrates 1131, 1132 and 1133 with a patch radiator 1134 formed on a surface of the antenna substrate 1133.

Moreover, the peripheral regions of the exposed surface of the antenna substrate 1131 have contact pads 1136 formed thereon. The contact pads 1136 are connected to conductive interconnects 1135 (including a series of conductive through vias and metal traces) that are formed as part of the antenna substrate layers 1131, 1132 and 1133 (or the interface layer 1120) between the RFIC chip 1110 and the contact pads 1136. Wire bond connections 1146 are formed between the contact pads 1136 on the exposed surface of the antenna substrate 1131 and contact pads 1144 on the application board 1140, to thereby provide DC supply, or control or I/O baseband signal connections between the RFIC chip 1110 and the application board 1140. Moreover, as shown in FIG. 11, non-active BGA connections 1143 are used to connect the antenna structure 1130 to the application board 1140. An optional heat sink 1150 can be attached to the non-active surface of the semiconductor substrate 112 of the RFIC chip 1110, to provide means for dissipating heat generated by the RFIC chip 1110.

Figure 12:
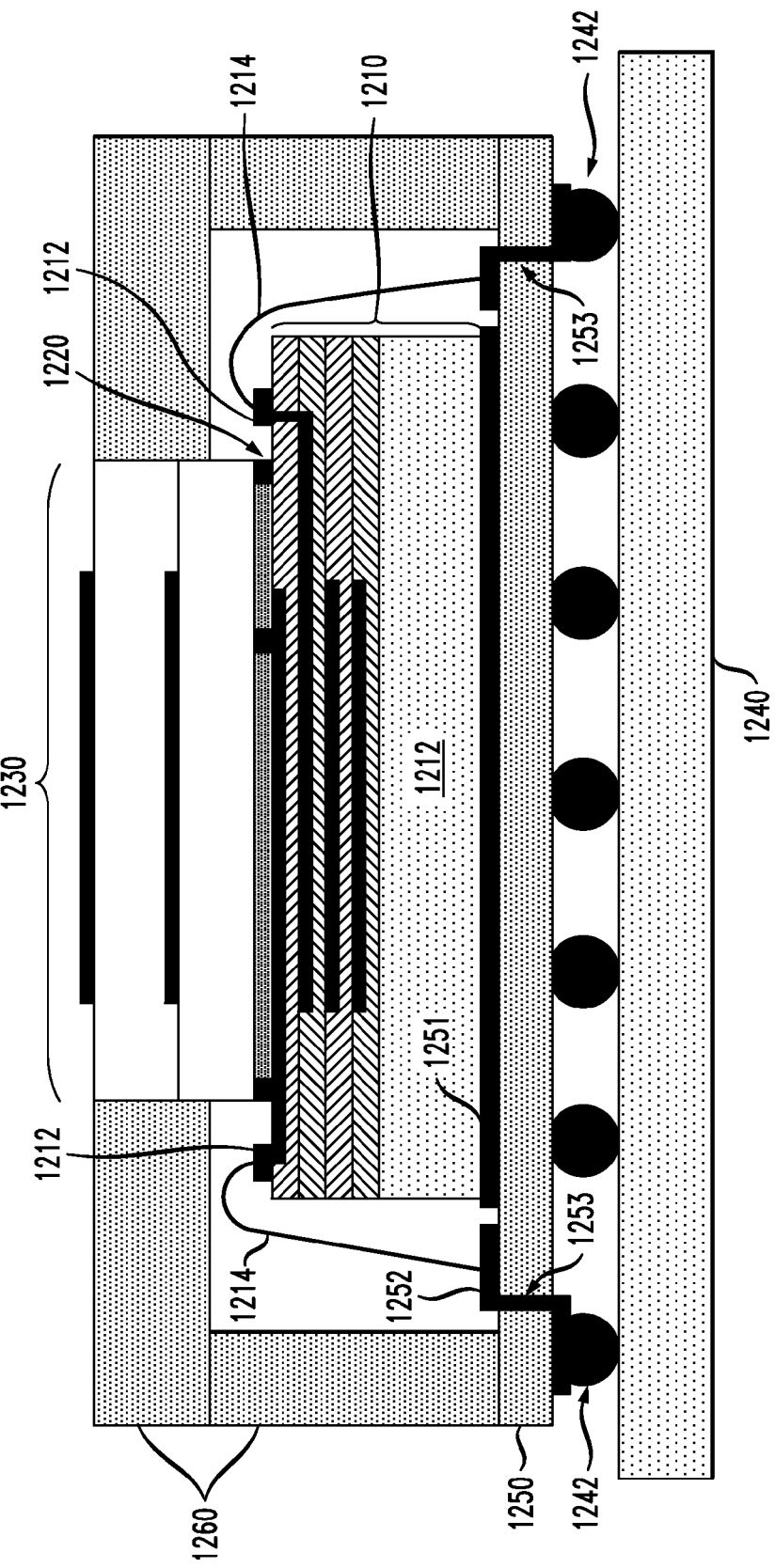
FIG. 12 schematically depicts a package structure comprising an antenna structure and integrated circuit chip, according to another exemplary embodiment of the invention.

In other exemplary embodiments of the invention, exemplary package structures according to principles of the invention can be implemented with conventional BGA or Land Grid Array (LGA) package concepts. For example, FIG. 12 schematically depicts a package structure comprising an antenna structure and integrated circuit chip, according to another exemplary embodiment of the invention, which is implemented in a BGA or LGA package. In particular, FIG. 12 is a side schematic view of a package structure 1200 comprising an RFIC chip 1210, antenna structure 1230 and an interface layer 1220 connecting the RFIC chip 1210 and the antenna structure 1230. The RFIC chip 1210 is bonded to a package substrate 1250 via a bonding layer 1251. A package encapsulation layer 1260 is formed around the sides and top of the RFIC chip 1210 and antenna package 1230, with an opening in a top regions of the encapsulation layer 1260 to allow for radiation to be emitted and captured by the antenna 1230. A plurality of contact pads 1212 are formed on the exposed peripheral regions of the upper surface of the RFIC chip 1210. Wire bond connections 1214 are formed between the contact pads 1212 on the RFIC chip 1210 and contact pads 1252 formed on the package substrate 1250. A plurality of conductive through vias 1253 are formed in the package substrate 1250 to form electrical connections between the contact pads 1252 and contacts 1242 formed between the bottom surface of the package substrate 1250 and the application board 1240, thereby providing DC supply, or control or I/O baseband signal connections between the RFIC chip 1210 and the application board 1240.

Those of ordinary skill in the art will readily appreciate the various advantages associated with integrated chip/antenna package structures according to embodiments of the invention. For instance, the exemplary package structure can be readily fabricated using known wafer-scale manufacturing and packaging techniques to fabricate and package antenna structures with semiconductor RFIC chips to form compact integrated radio/wireless communications systems for millimeter wave and Terahertz applications. Moreover, integrated chip packages according to exemplary embodiments of the invention enable antennas to be integrally packaged with IC chips such as transceiver chips, which provide compact designs with very low loss between the transceiver and the antenna. Various type of antenna designs can be implemented including patch antennas, slot antennas, slot ring antennas, dipole antennas, and cavity antennas, for example. Moreover, the use of integrated antenna/IC chip packages according to the present invention saves significant space, size, cost, and weight, which is a premium for virtually any commercial or military application.

Although exemplary embodiments have been described herein with reference to the accompanying drawings for purposes of illustration, it is to be understood that the present invention is not limited to those precise embodiments, and that various other changes and modifications may be affected herein by one skilled in the art without departing from the scope of the invention.

We claim:

1. A chip package, comprising:
   an RFIC (radio frequency integrated circuit) chip comprising a semiconductor substrate having an active surface and an inactive surface, and a BEOL (back end of line) structure formed on the active surface of the semiconductor substrate;
   an antenna structure comprising an antenna substrate and a planar antenna radiator fowled on a surface of the antenna substrate, wherein the antenna substrate is formed of a low loss semiconductor material;
   an interface layer connecting the antenna structure to the BEOL structure of the RFIC chip; and
   an antenna feed line formed as part of the BEOL structure of the RFIC chip.

2. The chip package of claim 1, further comprising contact pads formed on the surface of the antenna substrate and conductive vias foamed through the antenna substrate, wherein the conductive vias form electrical interconnects between the BEOL structure of the RFIC chip and the contact pads formed on the surface of the antenna substrate.

3. The chip package of claim 1, further comprising an antenna ground plane formed as part of the BEOL structure of the RFIC chip.

4. The chip package of claim 1, wherein the antenna substrate is a low loss silicon substrate.

5. The chip package of claim 1, wherein the antenna substrate comprises a stack of two or more antenna substrate layers.

6. The chip package of claim 1, wherein a footprint of the RFIC chip is larger than a footprint of the antenna structure.

7. The chip package of claim 1, wherein a footprint of the RFIC chip is smaller than a footprint of the antenna structure.

8. The chip package of claim 1, wherein the interface layer between the antenna structure and the BEOL structure comprises a plurality of metal stubs or rings and under fill material, which bond the antenna structure to the BEOL structure.

9. The chip package of claim 1, wherein the low loss semiconductor material is high resistivity silicon, silica, or quartz.

10. The chip package of claim 5, wherein at least one antenna substrate layer is a low loss silicon substrate and at least another antenna substrate layer is a silica substrate.

11. The chip package of claim 5, further comprising a metallization pattern disposed between two adjacent antenna substrate layers.

12. The chip package of claim 11, wherein the metallization pattern is an antenna ground plane that is disposed between the antenna radiator formed on the surface of the antenna substrate and an antenna feed line formed in the BEOL structure.

13. The chip package of claim 11, wherein the metallization pattern is a second antenna radiator.

14. The chip package of claim 11, wherein the metallization pattern is at least a portion of an electrical interconnect.

15. An apparatus, comprising;
    a chip package, comprising:
       an RFIC (radio frequency integrated circuit) chip comprising a semiconductor substrate having an active surface and an inactive surface; and a BEOL (back end of line) structure formed on the active surface of the semiconductor substrate;
       an antenna structure comprising an antenna substrate and a planar antenna radiator formed on a surface of the antenna substrate, wherein the antenna substrate is formed of a low loss semiconductor material; and
       an interface layer connecting the antenna structure to the BEOL structure of the RFIC chip;
    a circuit board, wherein the chip package is mounted to the circuit board; and
    electrical interconnect structures providing DC supply, ground, control and I/O baseband signal lines between the RFIC chip and the circuit board.

16. The apparatus of claim 15, wherein the electrical interconnect structures comprise:
    contact pads formed on the surface of the antenna substrate;
    contact pads formed on the surface of the circuit board;
    wire bonds formed between contacts pads on the surface of the antenna substrate and the circuit board; and
    conductive vias and metal traces formed in the antenna substrate connecting the contact pads on the surface of the antenna substrate with contacts in the BEOL structure.

17. The apparatus of claim 15, wherein the electrical interconnect structures comprise:
    conductive vias that are formed through the semiconductor substrate of the RFIC chip from the active surface to the inactive surface; and
    contact pads on a the inactive surface of the semiconductor subset of the RFIC chip forming electrical bonds to contact pads on the circuit board.

18. The apparatus of claim 15, wherein the antenna structure is bonded to the circuit board, wherein the circuit board has an opening forming a window for electromagnetic radiation to be emitted or captured by the antenna radiator.

19. The apparatus of claim 15, wherein the antenna structure is bonded to the circuit board, wherein the circuit board has an opening forming a window through which the RFIC chip is inserted.

20. The apparatus of claim 15, wherein the inactive surface of the semiconductor substrate of the RFIC chip is bonded to the circuit board.

21. The apparatus of claim 15, wherein the low loss semiconductor material is high resistivity silicon, silica, or quartz.

* * * * *